US010414648B2

(12) United States Patent
Reig et al.

(10) Patent No.: US 10,414,648 B2
(45) Date of Patent: Sep. 17, 2019

(54) METHOD OF MAKING A CLOSED CAVITY COMPRISING A FLAP PROTECTING THE CAVITY WHEN IT IS CLOSED

(71) Applicant: COMMISSARIAT A L'ENERGIE ATOMIQUE ET AUX ENERGIES ALTERNATIVES, Paris (FR)

(72) Inventors: Bruno Reig, Moirans (FR); Damien Saint-Patrice, Chabeuil (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 15/385,209

(22) Filed: Dec. 20, 2016

(65) Prior Publication Data
US 2017/0183224 A1   Jun. 29, 2017

(30) Foreign Application Priority Data

Dec. 23, 2015  (FR) ...................................... 15 63190

(51) Int. Cl.
*B81C 1/00* (2006.01)
*B81B 7/00* (2006.01)

(52) U.S. Cl.
CPC ........ *B81C 1/00285* (2013.01); *B81B 7/0038* (2013.01); *B81C 1/00333* (2013.01); *B81B 2203/0315* (2013.01)

(58) Field of Classification Search
CPC ... H01L 2224/0558; H01L 2224/05644; H01L 2224/48463; H01L 2224/97; H01L 2924/1461
See application file for complete search history.

(56) References Cited

U.S. PATENT DOCUMENTS

2004/0166606 A1   8/2004  Forehand
2008/0041607 A1   2/2008  Robert
(Continued)

FOREIGN PATENT DOCUMENTS

FR    2 864 340    6/2005
FR    2 948 928    2/2011
(Continued)

OTHER PUBLICATIONS

French Preliminary Search Report dated Jul. 21, 2016 in French Application 15 63190 filed on Dec. 23, 2015 (with English Translation of Categories of Cited Documents).

*Primary Examiner* — Tony Tran
(74) *Attorney, Agent, or Firm* — Oblon, McClelland, Maier & Neustadt, L.L.P.

(57) ABSTRACT

Method for making a cavity, comprising steps to:
  make a hole in a cover covering a sacrificial portion on a substrate;
  make a first layer on the cover, either in a first configuration covering a first region of the cover around the hole, or in a second configuration surrounding a first region of the cover around the hole;
  deposit a second layer covering the cover and the first layer and with, in a first configuration a low adhesion force between the first and second layers, or in a second configuration a low adhesion force between the second layer and the first region;
  etch the second layer, forming a flap of which a first part does not hermetically close or seal the hole, and of which a second end is fixed to a second region of the cover;
  etch the sacrificial portion;
  close the cavity.

19 Claims, 5 Drawing Sheets

(56) References Cited

U.S. PATENT DOCUMENTS

| | | |
|---|---|---|
| 2008/0079142 A1 | 4/2008 | Carmona et al. |
| 2011/0030989 A1 | 2/2011 | Baillin et al. |
| 2011/0053321 A1 | 3/2011 | Huang |
| 2012/0094323 A1* | 4/2012 | Dekker ................ C12N 5/0657 435/32 |
| 2012/0161255 A1 | 6/2012 | Gabert et al. |

FOREIGN PATENT DOCUMENTS

| | | |
|---|---|---|
| WO | WO 2006/081636 A1 | 8/2006 |
| WO | WO 2011/003908 A1 | 1/2011 |

* cited by examiner

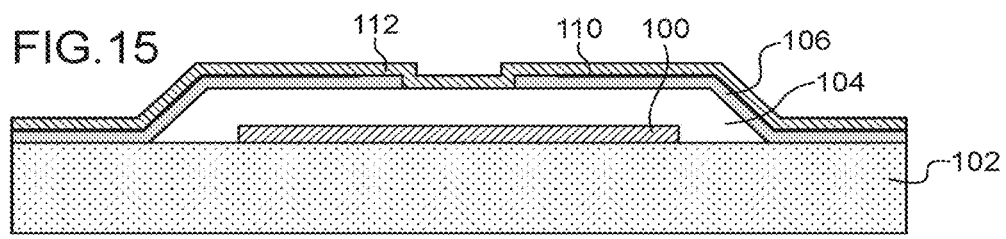
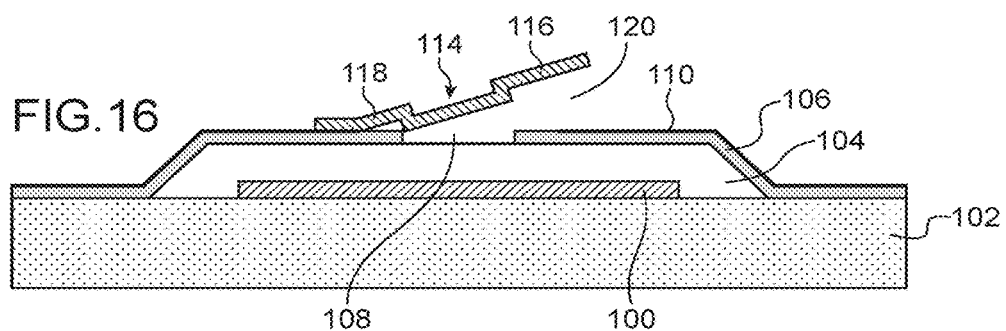
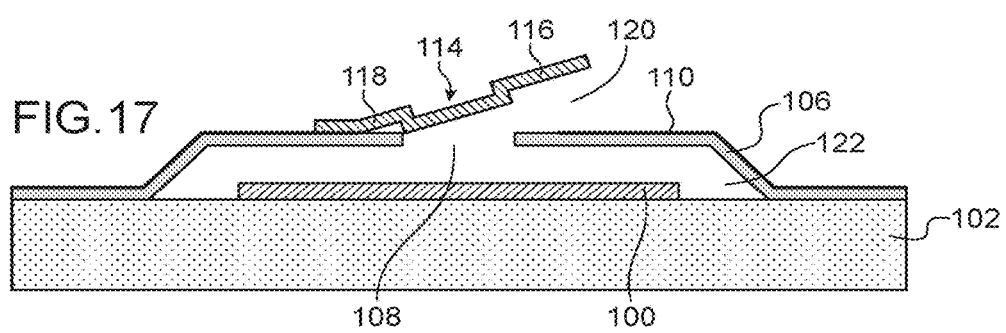
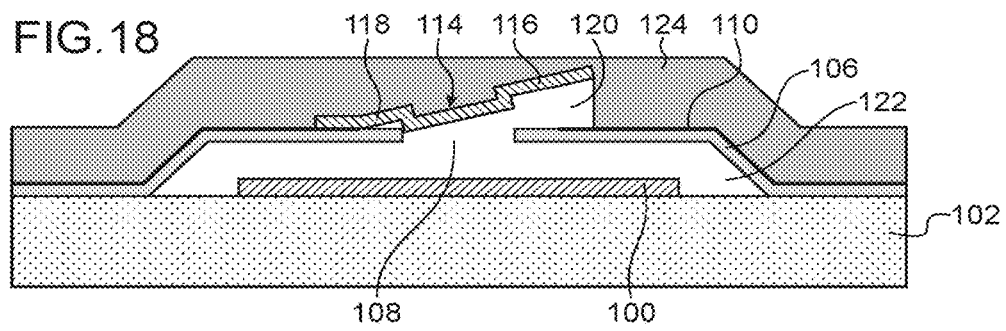

METHOD OF MAKING A CLOSED CAVITY COMPRISING A FLAP PROTECTING THE CAVITY WHEN IT IS CLOSED

TECHNICAL DOMAIN AND PRIOR ART

This document relates to the field of microelectronics and more particularly to the manufacturing of closed cavities used particularly for the encapsulation of microelectronic devices for example of the MEMS (MicroElectroMechanical Systems) and/or NEMS (NanoElectroMechanical Systems) and/or MOEMS (MicroOptoElectroMechanical Systems) and/or NOEMS (NanoOptoElectroMechanical Systems) type.

In particular, it discloses a "Thin-Film Packaging" (TFP) type encapsulation method. Such an encapsulation is advantageously used collectively for several microelectronic devices made on the same substrate, then making a "Wafer Level Packaging" (WLP).

Many microelectronic devices require packaging in order to function. This packaging firstly performs a protection role against some disturbances in the outside environment (dust, humidity, pressure variation, influence of gases, etc.), and secondly is used to make the device functional. This is the case for MEMS or NEMS microsystems for which the operation of mobile parts may require control of the atmosphere and/or pressure ($N_2$ atmosphere for MEMS microswitches, vacuum environment for MEMS resonators, etc.).

A thin film packaging type encapsulation method has been developed in a context of miniaturisation and cost reduction of devices.

This method consists of depositing a layer of sacrificial material (for example silicon or organic resin) locally above the device to be protected. The material forming the cover (for example an inorganic layer such as $SiO_2$) is then deposited on this sacrificial layer and holes are made in this layer, for example in a dry etching step. The sacrificial material is then eliminated through these holes, usually in a dry isotopic etching step, in order to release the cover and to form a cavity in which the device is encapsulated. The holes are then plugged to obtain an hermetically or airtight sealed cavity.

The plugging step is usually done either by deposition (Physical Vapour Deposition—PVD, Plasma Enhanced Chemical Vapour Deposition—PECVD, etc.) of metallic or inorganic layers, or by spin coating a polymer. The difficulty in implementing this plugging consists of not depositing any plugging material inside the cavity, which could be prejudicial to effective operation of the encapsulated microelectronic device.

Therefore the diameter and the number of release holes are defined so as to find a compromise between a short release time obtained by making release holes with the largest possible diameter, and ease of plugging obtained by making release holes with the smallest possible diameter.

Several solutions have been put forward to eliminate the need for this compromise and avoid deposition of plugging material in the cavity.

Document US 2012/0161255 A1 discloses the use of a CVD deposition of a first pre-plugging layer in the release holes to limit the residual deposition of plugging material in the cavity, since this can reduce the size of the holes, and a second CVD deposition of plugging material can then be made for final plugging of the holes under the required atmosphere conditions. However, this method cannot completely avoid residual deposits of pre-plugging and plugging materials in the cavity. Moreover, the diameter of the holes is limited to not more than a few microns so that they can be plugged by attempting to avoid residual deposits in the cavity.

In document US 2004/0166606 A1, the residual deposit of the plugging material in the cavity is avoided by choosing a plugging material that is sufficiently viscous so that it does not flow into the cavity during the plugging step. In this case, the range of plugging materials that can be used is limited to sufficiently viscous materials. Moreover, the diameter of the holes is also limited to not more than a few microns so that they can be plugged without any residual deposits in the cavity.

Document US 2011/0053321 A1 discloses that the plugging material can be deposited forming an angle between the plate through which the holes to be plugged will pass and the direction of deposition of the plugging material in the deposition chamber, to avoid residual deposits of plugging material in the cavity. The plugging material is thus not deposited perpendicular to the hole and the deposit of plugging material inside the cavity is limited. However the disadvantage of this method is the need to have a specific deposition chamber in which the deposition can be made at a particular angle from the cover.

In document WO 2006/081636 A1, the cover is composed of a porous layer. The pores of this layer are used as release holes to eliminate the sacrificial layer. These pores are very fine (with height/diameter ratios of more than 10 and diameters of less than a micron) such that the plugging material cannot pass through these holes to be deposited in the cavity. The disadvantage of this technique is the technological difficulty of making a cover made of a porous material, and also the fact that there is a limited choice of materials from which this cover can be made.

Document WO 2011/003908 A1 discloses that release holes can be formed around the periphery of the cover. If the plugging used leaves residual deposits inside the cavity, these deposits are located around the periphery of this cavity, in zones in which this residual deposit does not disturb the encapsulated device. However, the disadvantage of this method is that it takes a very long time to release the entire cavity from a hole located on the periphery.

In document US 2008/0079142 A1, a cover is formed in two layers at a spacing from each other and through each of which release holes are drilled. Holes made in each of these layers are not superposed, thus forming a network of baffles to access into the cavity from the outside. The closest layer of the encapsulated device then acts as a layer providing protection from the plugging material, the residual deposits being made on this protective layer and not on the device inside the cavity. The main disadvantage of this technique is the addition of many additional technological steps to form the second cover layer (additional sacrificial layer, second cover layer with release holes, release between two covers) that have an important repercussion on the final cost of the device.

Document FR 2 948 928 A1 discloses a system made to act as a flap. This flap is in the open position for the release step and is then brought into the closed position under the release hole during the plugging step. The release hole can thus be large, the plugging material being deposited inside the hole pressing on the flap. Document FR 2 864 340 A1 also discloses a system with a flap located above the cover. In both of these documents, the flap is made on an additional sacrificial layer and therefore these processes require the use of additional technological steps to deposit and position this sacrificial layer, and then to eliminate this additional sacrificial layer.

PRESENTATION OF THE INVENTION

Therefore there is a need to for a method of making a closed cavity that can be used for encapsulation of one or several microelectronic devices that does not have the disadvantages of previously described encapsulation methods, in other words that can:

eliminate the need to make a compromise related to the dimensions of the release hole(s);
avoid the deposition of plugging material in the cavity;
not limit the method to specific types of plugging material;
avoid the use of a specific deposition chamber that enables the deposition of the plugging material at a particular angle from the cover;
avoid the production of a cover made of a porous material;
quickly etch the sacrificial part forming the cavity;
limit the number of additional steps not included in a classical PCM encapsulation method;
avoid the use of an additional sacrificial layer not used in a classical PCM encapsulation method.

One embodiment achieves this by disclosing a method of making at least one closed cavity, including at least:

making a sacrificial portion on a substrate;
making a cover covering the sacrificial portion;
making at least one hole through the cover;
making a first layer on the cover such that, in a first configuration, the first layer covers at least a first region of the cover located around the hole, or in a second configuration, the first layer surrounds the first region of the cover;
depositing at least one second layer covering the cover and the first layer and such that in the first configuration, an adhesion force between the first and the second layers is less than an adhesion force between the second layer and a second region of the cover adjacent to the first region of the cover, or in the second configuration, an adhesion force between the second layer and the first region of the cover is less than an adhesion force between the first and second layers;
etching the second layer such that a remaining portion of the second layer forms at least one flap, of which a first part located facing the hole and the first region of the cover does not hermetically close or seal the hole, and of which a second part is fixed to the second region of the cover;
etching the sacrificial portion through the hole, forming the cavity between the cover and the substrate;
closing the cavity by a deposition of a plugging material at least on the first part of the flap and at least a part of the cover around the first region of the cover.

Therefore this method uses a first layer for which the adhesion characteristics are different from the cover. Thus the flap that comprises a first part located at the first region of the cover and a second part located at a second region of the cover, is made on two zones with different adhesions and such that only the second part of the flap is anchored to the cover, either directly to it in the case of the first configuration in which the first layer covers the first region of the cover, or through the first layer in the case of the second configuration in which the first layer surrounds the first region of the cover and covers the second region of the cover.

In the first configuration, the first layer covers the first region of the cover and forms the zone at which the flap (its first part) will not be firmly fixed or anchored to the cover. In the second configuration, the first layer is formed around this first region of the cover that directly forms the zone at which the flap (its first part) will not be firmly fixed or anchored to the cover.

This lack of adhesion or this low adhesion between the first part of the flap and the first layer (in the case of the first configuration) or the first region of the cover (in the case of the second configuration) enables the flap to not hermetically close or seal the hole, and therefore to etch the sacrificial portion through the hole, even if the first part of the flap is located on or covers the hole.

This method avoids the deposition of plugging material in the cavity due to the fact that the flap is present above the hole when the plugging material is deposited. This also makes it possible to make one or several large holes (diameter possibly equal to several tens of microns or even more than about 100 microns) without the risk of depositing plugging material in the cavity.

This method is also compatible with all types of plugging material, it does not require deposition of the plugging material in a particular deposition chamber, does not require the production of a cover made of a porous material, makes it possible to locate the holes at any position on the cover, and does not require the production of an additional sacrificial layer used to make the flap.

In the first configuration, the flap may adhere to the second region of the cover and not to the first layer or, according to the second configuration, the flap may adhere to the first layer and not to the first region of the cover. The expression "not adhere" must be understood as meaning that the flap is not firmly anchored, or fixed, to the first layer (in the case of the first configuration) or to the first region of the cover (case of the second configuration). This expression may mean that the first part of the flap forms a free part not fixed to the first layer (first configuration) or the first region of the cover (second configuration).

In the first configuration, an adhesion force between the second layer and the second region of the cover may be greater than or equal to about 20 N/mm$^2$ or, according to the second configuration, an adhesion force between the first and second layers may be greater than or equal to about 20 N/mm$^2$. Such an adhesion force can give a good anchorage of the second part of the flap with the cover (directly or through the first layer depending on the envisaged configuration).

According to a first example of the first configuration, the cover may include $SiO_2$ and/or SiN and/or at least one metal such as Al, Au, etc., the first layer may include a polymer such as PTFE, and the second layer may include $SiO_2$ and/or SiN and/or at least one metal or a stack of several metals such as Au, Ti, Al, Ni, AlSi, AlCu, etc. According to a second embodiment of the first configuration, the cover may include $SiO_2$ and/or SiN, the first layer may include Ru and/or Ti+Au and/or W+Au, and the second layer may include $SiO_2$ deposited with a precursor gas of TEOS and/or SiN.

According to a first example embodiment of the second configuration, the cover may include $SiO_2$ and/or SiN, the first layer may comprise at least one metal or a stack of several metals such as Ti and/or W and/or TiN, and the second layer may include Au and/or Cu and/or Pt and/or Ni.

According to a second example embodiment of the second configuration, the cover may include Au, the first layer may include $SiO_2$ deposited with an $SiH_4$ precursor gas, and the second layer may include $SiO_2$ deposited with a TEOS precursor gas.

The second layer may have a residual stress generating a bending, or deformation, in the first part of the flap after the second layer has been etched, creating a space between the first part of the flap and the first region of the cover and such that the first part of the flap remains facing the hole. Such a space is very beneficial because it accelerates etching of the sacrificial portion without comprising the protection procured by the flap because the first part of the flap remains facing the hole during deposition of the plugging material.

It is also possible that the second layer comprises at least distinct first and second materials, superposed such that the first material is located between the second material and the cover, and with different values and/or types of residual stresses creating a deformation of the first part of the flap creating a space between the first part of the flap and the first region of the cover, after etching of the second layer. Once again, such spacing is very beneficial because it accelerates etching of the sacrificial portion.

The method may also comprise an etching step of at least part of the second material, between etching of the sacrificial portion and closing of the cavity. This etching of at least part of the second material makes it possible to return the flap to its initial position or to a position close to its initial position, once etching of the sacrificial portion has been completed, before the plugging material is deposited.

In this case, the first material and/or the second material may include a residual stress.

The residual stress may be a compression stress or a tension stress. The first and second materials may or may not have the same type of stress (compression or tension). The residual stress of the second material may be higher than that of the first material so that the flap can lift. For example, the second material may have a tension stress higher than the stress in the first material or a compression stress lower than the stress in the first material.

Regardless of whether or not the second layer is made with one or several materials with residual stresses, the second layer may comprise at least first and second distinct materials superposed such that the first material is located between the second material and the cover, the first material possibly having a higher coefficient of thermal expansion than the second material, and etching of the sacrificial portion can be done at a temperature leading to a deformation of the first part of the flap due to thermal expansion of the first and second materials, creating a space between the first part of the flap and the second region of the cover.

Furthermore, deposition of the plugging material may beneficially be done at ambient temperature, such that the flap can return to its initial position when the plugging material is deposited.

BRIEF DESCRIPTION OF THE DRAWINGS

This invention will be better understood after reading the description of example embodiments given purely for information and that are in no way limitative with reference to the appended drawings on which:

FIGS. 12 to 18 show the steps of a method of making a closed cavity according to a second embodiment.

Identical, similar or equivalent parts of the different figures described below have the same numeric references to facilitate comparison between the different figures.

The different parts shown on the figures are not necessarily all at the same scale, to make the figures more easily understandable.

It must be understood that the different possibilities (variants and embodiments) are not mutually exclusive and that they can be combined with each other.

DETAILED PRESENTATION OF PARTICULAR EMBODIMENTS

Refer firstly to FIGS. 1 to 7 that show the steps in a first embodiment of a method for making a closed cavity 122 used for encapsulation of a microelectronic device 100.

The microelectronic device 100, in this case of the MEMS or NEMS type, is firstly made on a substrate 102, for example made of a semiconductor such as silicon.

Figure 1:
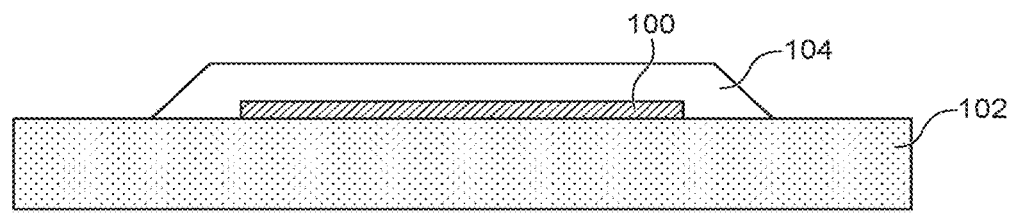
FIGS. 1 to 7 show the steps of a method of making a closed cavity according to a first embodiment.

A sacrificial portion 104 is then made on the substrate 102 such that it covers the device 100 and its volume corresponds approximately to the volume of the cavity 122 in which the device 100 will be encapsulated (FIG. 1). The sacrificial portion 104 may for example be obtained by the deposition of a layer of sacrificial material, for example an organic resin deposited by spin coating, the thickness of which corresponds to the required height of the cavity 122, usually between about 1 µm and 10 µm and for example equal to about 5 µm.

Photolithography is then applied to the layer of sacrificial material that is then etched so that only the sacrificial portion 104 is kept on the substrate 102.

Figure 2:
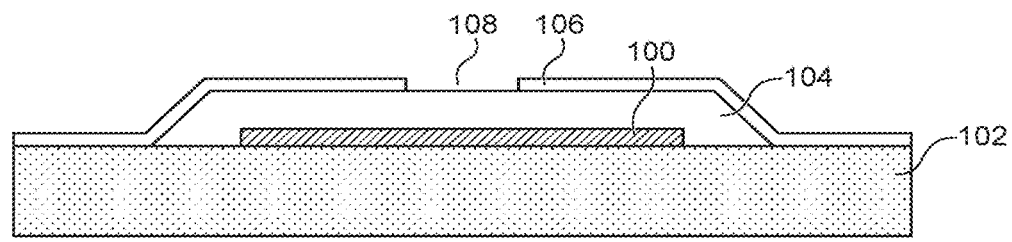

As shown on FIG. 2, a cover 106 is then made covering the sacrificial portion 104 (and in the example described herein also covering the top face of the substrate 102 around the portion 104). For example, this cover 106 comprises an inorganic layer of $SiO_2$ with a thickness equal to approximately 3 µm and deposited by PECVD. At least one hole 108 is made through the cover 106, for example by photolithography and etching (in this case Reactive Ion Etching (RIE)). This hole 108 will be used to etch the sacrificial portion 104 that will be used to release the device 100 and form the cavity 122.

A first layer 110 is then formed on the cover 106 locally in the hole 108 and covering a first region of the cover 106 located around the hole 108. This may be done for example by depositing a photosensitive resin on the cover 106. Photolithography and etching are then applied to form at least one opening in the resin at the location required for the first layer 110. The material of the first layer 110 is then deposited on the surface thus created, in other words on the resin layer and in the opening passing through the resin layer. A lift-off type process is then used to eliminate the photosensitive resin, at the same time removing the parts of material covering the resin. The material kept on the cover 106 corresponds to the first layer 110 located in the opening formed previously in the photosensitive resin.

In the first embodiment described herein in which the first layer 110 covers the first region of the cover 106 located around the hole 108, the material of the first layer 110 is such that it has a low or practically zero adhesion force with the materials of a flap 114 that will subsequently be made facing the hole 108. This adhesion force is less than about 2 $N/mm^2$. This practically zero or low adhesion force is obtained by means of the choice made for the first layer 110 and the flap 114. In the example embodiment described herein, the material in the first layer 110 is a polymer, for example of the polytetrafluoroethylene (PTFE) type obtained by a deposit made with a fluorinated gas plasma such as $C_4F_8$.

Figure 3:
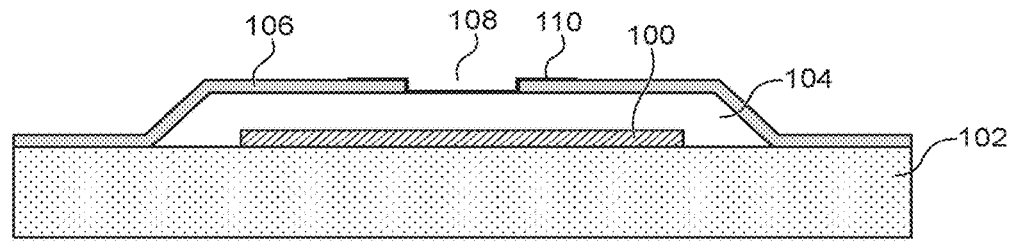

On FIG. 3, a single first layer 110 is made on the cover 106 covering the first region of the cover 106 located around the hole 108. A part of the first layer 110 is also located in the hole 108, covering the side walls of the hole 108 and a part of the sacrificial portion 104 facing the hole 108.

Figure 4:
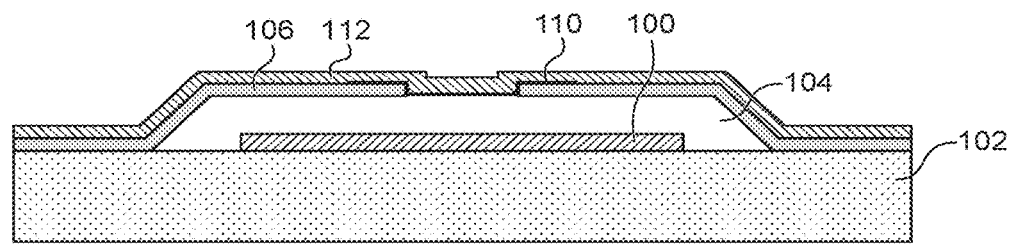

A second layer 112 from which the flap 114 will be made is then deposited on the entire structure previously obtained (FIG. 4). The material of the second layer 112 may for example by AlSi deposited by PVD. The second layer 112 has a thickness for example equal to about 1 μm. AlSi is a material that has the advantage of having a residual stress of around of a few hundred MPa so that the flap 114 can have a stress gradient within its thickness of around a few tens of MPa and, after the flap 114 has been made, can form a space opposite the hole 108.

Photolithography and wet etching are then performed on the second layer 112 such that a remaining portion of the second layer 112 forms the flap 114. The flap 114 comprises at least a first part 116 corresponding to the remaining part of the second layer 112 that is located on the first layer 110, in others words facing the hole 108 and the first region of the cover 106 covered by the first layer 110. This first part 116 of the flap 114 is not fixed or anchored to the first layer 110 due to the low or practically zero adhesion between the material of the first layer 110 (polymer) and that of the flap 114 (AlSi in the example described herein). Therefore the hole 108 is not hermetically closed or sealed by the first part 116 of the flap 114.

The flap also comprises a second part 118 that is in direct contact with a second region of the cover 106 and is fixed to or anchored to this second region of the cover 106. The materials of the flap 114 and the cover 106 are such that the adhesion force between the second part 118 of the flap 114 and the cover 106 is greater than or equal to about 20 $N/mm^2$.

Thus in this first embodiment, the materials in the cover 106, the first layer 110 and the second layer 112 are chosen such that the adhesion force between the first and second layers 110, 112 is less than about 2 $N/mm^2$ and such that the adhesion force between the second layer 112 and the second region of the cover 106 is greater than or equal to about 20 $N/mm^2$.

Figure 5:
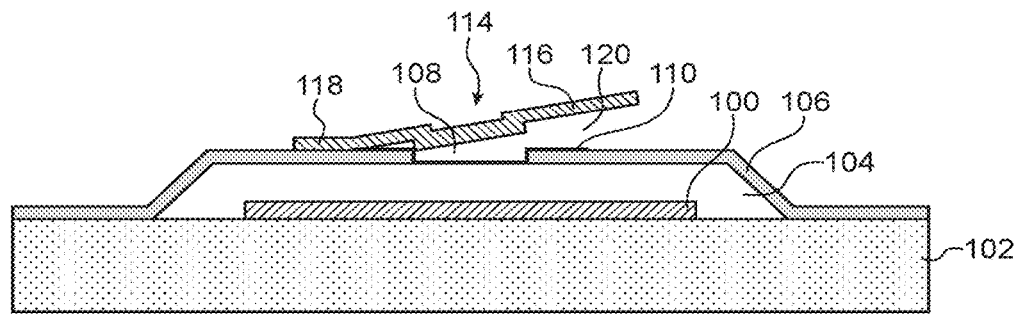

On the example in FIG. 5, the first part 116 of the flap 114 corresponds to a part of the flap 114 forming a first edge or a first end of the flap 114 free to move relative to a second edge or a second end of the flap 114 opposite the first edge or the first end of the flap 114 and formed by the second part 118.

As a result of the stress gradient applied to the flap 114 (due to the residual stress present in the material of the deposited second layer 112), and as a result of the low or practically zero adhesion force between the first part 116 of the flap 114 and the first layer 110 and the large adhesion force between the second part 118 of the flap 114 and the cover 106, the first part 116 of the flap 114 is deformed and forms a space 120 between the first layer 110 and the first part 116 of the flap 114, facilitating access to the hole 108 and to the sacrificial part 104 from outside the cover 106. The space 120 forms a release vent facilitating access to the hole 108.

Figure 6:
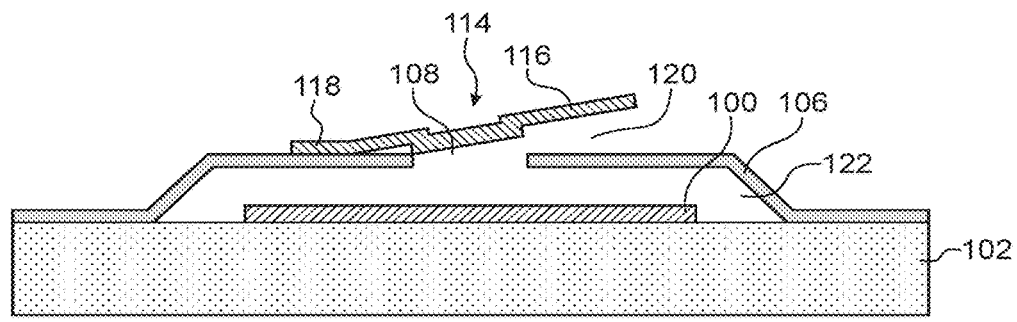

The first layer 110 and the sacrificial portion 104 are then eliminated by etching agents, for example one or several release gases such as an $O_2$ plasma, brought into contact with the first layer 110 and the sacrificial portion 104 from the access formed by the space 120 and through the hole 108. Elimination of the sacrificial portion 104 forms the cavity 122 in which the microelectronic device 100 is encapsulated (FIG. 6).

Figure 7:
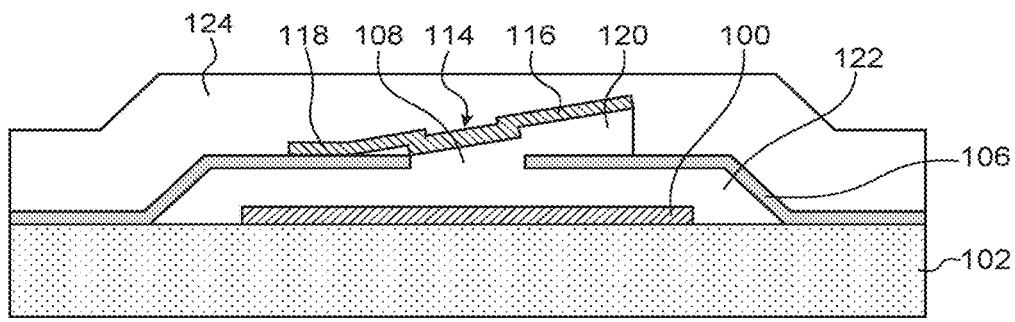

The cavity 122 is then plugged by depositing a plugging material 124, in this case in the form of a layer covering the entire structure made (FIG. 7). Since access to the cavity 122 takes place through the hole 108 and the space 120 formed under the first part 116 of the flap 114, and since the deformation of the first part 116 of the flap 114 is such that the first part 116 of the flap 114 remains in position facing the hole 108, the plugging material 124 covers the cover 106 and the flap 114, with no risk of a residual deposit of the plugging material 124 inside the cavity 122. The layer of plugging material 124 is made to be sufficiently thick so that it obstructs access to the space 120 and thus hermetically closes the cavity 122. The plugging material 124 can be deposited by a CVD, PVD type deposition, or by a spin coating deposition. The plugging material 124 may for example be BCB (Benzo-Cyclo-Butene).

Figure 8:
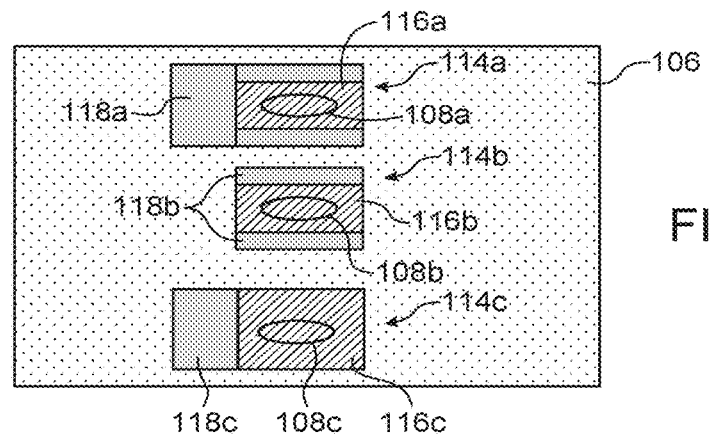
FIG. 8 shows different example embodiments of the flap formed when the method of making the closed cavity is used.

There are different possible configurations of the flap 114 and the first layer 110. FIG. 8 shows three example embodiments of the flap 114 and the first layer 110. In the three flaps 114a, 114b et 114c shown on FIG. 8, the cross-hatched part corresponds to the first part referenced 116a, 116b and 116c of each of the flaps 114a, 114b, 114c respectively, in other words the part of the flap facing the first layer 110.

Each flap 114a, 114b, 114c comprises a portion derived from the second layer 112 and with a rectangular section in a plane parallel to the plane of the top face of the cover 106 on which the flap 114a is made. Furthermore, for the three example embodiments shown on FIG. 8, the first layer 110 (not visible on FIG. 8) has a rectangular section in a plane parallel to the plane of the top face of the cover 106, and is formed around each hole referenced 108a, 108b and 108c respectively. Thus, since the first layer 110 is similar in the three example embodiments shown on FIG. 8, the flaps 114a, 114b, 114c include first parts 116a, 116b, 116c that have a similar shape and dimensions to each other.

The first flap 114a is anchored to the cover 106 by the parts of the portion of material of the flap 114a forming the second part 118a of the flap 114a, these parts being located on three sides of the rectangular portion of material forming the flap 114a. Thus, the space 120 formed between the first part 116a of the flap 114a and the first layer 110 forms a blind channel delimited by the second part 118a of the flap 114a on three sides at which the flap 114a is anchored to the cover 106.

The second flap 114b is anchored to the cover 106 by the parts of the portion of material of the flap 114b forming the second part 118b of the flap 114b and located on two opposite sides of the rectangular portion of material forming the flap 114b. Thus, the space 120 obtained between the first part 116b of the flap 114b and the first layer 110 forms a channel delimited by the second part 118b on two opposite sides at which the flap 114b is anchored to the cover 106.

Finally, the third flap 114c is anchored to the cover 106 by the part of the portion of material of the flap 114c forming the second part 118c of the flap 114c and located on a single side of the rectangular portion of material forming the flap 114c. Thus the flap 114c forms a beam of which a first end corresponding to the second part 118c, is fixed to the cover 106 and of which a second end opposite the first end and formed by the first part 116c is at a spacing from the cover 106 and the first layer 110.

In the first embodiment described above, the flap 114 is made from a layer of a single material with a residual stress such that the first part 118 of the flap 114 is at a spacing from the first layer 110 during etching of the sacrificial portion 104 and during deposition of the plugging material 124.

According to a first variant, the flap 114 can be made from a second layer 112 corresponding to a multilayer comprising different materials with different mechanical properties from each other.

Figure 9:
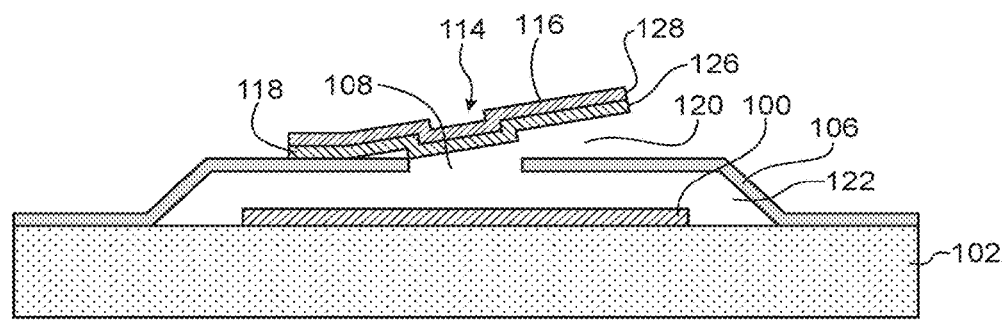
FIGS. 9 to 10 show steps in the method of making the closed cavity according to a variant of the first embodiment.

FIG. 9 shows an example of a flap 114 comprising two materials with different residual stresses. For example, the flap 114 comprises a layer 126 of a first material, in this case $SiO_2$ deposited by PECVD and with a thickness that can be between about 1 μm and 2 μm. The residual stress in this layer 126 is compressive and is low, for example between about 20 MPa and 100 MPa. The flap 114 also comprises a layer 128 corresponding to a stack of several metals deposited by PVD. For example, this stack of metals can comprise a sub-layer of titanium with a thickness for example equal to about 20 nm, and a layer of nickel with a thickness for example equal to about 400 nm.

The sub-layer of titanium can improve adhesion of the nickel layer on layer 126.

The residual stress in the nickel layer 126 is tensile and is high, for example between about 100 MPa and 1000 MPa. The residual tensile stress in the nickel present in the layer 128 of the flap 114 is additional to the residual compressive stress in the layer 126 of the flap 114. Thus, considering the global residual stress applied to the flap 114, this stress will deform the first part 116 of the flap 114 and form the space 120 between the first part 116 of the flap 114 and the cover 106.

Residual stresses in layers 126, 128 are obtained as result of the materials used, but can also be accentuated or reduced by means of deposition parameters (temperature, speed, plasma power, etc.) used during deposition of layers 126, 128. Heat treatments performed after these depositions can also contribute to obtaining the required residual stresses.

The lift of the first part 116 of the flap 114 can be relatively high so that the opening formed by the space 120 can be increased so as to accelerate release of the device 100, in other words etching of the sacrificial portion 104.

Once this release has been obtained, the most highly stressed layer of the flap 114, in other words the layer 128 in the example described above, can be eliminated. The flap 114, that then only comprises the layer(s) remaining after this etching, in this case layer 126, is then relaxed into its least stressed form by returning to its initial position (or slightly deformed depending on the residual stress in the materials in the remaining layers). The layer 128 can then be eliminated by applying dry etching. In the case described below, the layer 128 corresponds to a stack of a sub-layer of titanium and a layer of nickel. Since the deformation of the first part 116 of the flap 114 is due to the residual tensile stress provided by the nickel layer, it could be envisaged that only the nickel layer is eliminated so that the flap 114 returns to its initial position. In general, the etching applied to eliminate the material(s) that caused the deformation of the flap 114 is selective relative to the materials present, particularly to avoid damaging the device 100.

Figure 10:
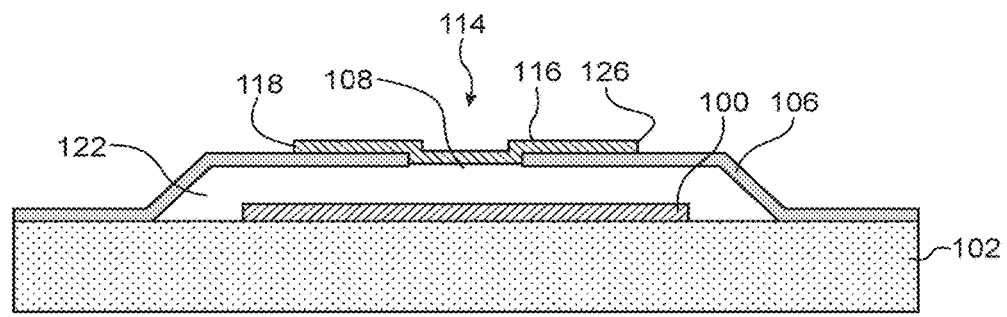

Thus, the flap 114 moves down towards the cover 106, reducing the dimensions of the space 120, or even eliminating it as in the example on FIG. 10 on which the flap 114 consists only of the layer 126 that completely closes the hole 108. This facilitates hermetic closing of the cavity 122 obtained by depositing the plugging material 124.

According to a second variant, the flap 114 can be made from several layers of different materials with different thermomechanic properties. In this case, a flap 114 similar to that shown on FIG. 9 is made. However, in this case the layers 126, 128 have different coefficients of thermal expansion instead of different residual stresses. During etching of the sacrificial portion 104, a sufficiently high temperature is applied to the flap 114 to lift its first part 116 and form the space 120 facilitating access to the hole 108 and to the sacrificial portion 104.

According to this second variant embodiment, the layer 126 of the flap 114, in other words the layer between the cover 106 and the layer 128, comprises a first material with a coefficient of thermal expansion higher than that of a second material of the layer 128. The following table contains examples of metals that could be used to make the layers 126, 128 of the flap 114, and values of the coefficients of thermal expansion a of these materials:

| Metal | $\alpha$ ($10^{-6}/°$ C.) |
| --- | --- |
| Al | 23.1 |
| Cu | 16.5 |
| Ni | 13.4 |
| Pt | 8.8 |
| Ti | 8.6 |
| Zr | 5.7 |

For example, the layer 126 may include aluminium and the layer 128 may include titanium. In this case, when the sacrificial portion 104 is etched at a sufficiently high temperature, usually more than about 100° C. and for example of around 200° C., the first part 116 of the flap 114 is deformed, creating the space 120 that facilitates the passage of etching agents to the sacrificial portion 104. Once the sacrificial portion 104 has been completely etched, the encapsulated structure obtained is returned to ambient temperature so that the flap 114 can return to its initial undeformed position. The cavity 112 can then be hermetically plugged by deposition of the plugging material 124. When plugging is done at a temperature higher than the temperature that deforms the first part 116 of the flap 114, one of the layers of the flap 114, for example layer 128, participating in its deformation can be eliminated before this plugging is done to prevent the flap 114 being deformed when it is plugged. When plugging is done at a temperature lower than the temperature that deforms the flap 114, the materials of the flap 114 with different coefficients of thermal expansion can be kept. When the layer 126 is made of titanium, or more generally comprises a getter material, considering the getter properties of this material, in other words its ability to adsorb and/or absorb gas molecules such as $H_2O$, $H_2$, CO, $CO_2$, $N_2$, $O_2$ molecules, the final pressure in the cavity 122 can be adjusted by activating the material of the layer 126 by heating to a temperature greater than or equal to its activation temperature, usually between about 250° C. and 400° C.

The two variants described above can be combined with each other. Thus, the flap 114 can be made from several layers of materials with different residual stresses but also different coefficients of thermal expansion. This can be done particularly by making each of the first and second layers 126, 128 as a multilayer or a stack of several different materials. Thus, sufficient deformation of the flap 114 can still be obtained by combining the deformation due to the effect of residual stresses in the materials present and the deformation due to thermal expansion in these materials, even if the temperature at which the sacrificial portion 104 is etched is limited or if the materials forming the flap 114 have moderate residual stresses or coefficients of thermal expansion.

According to another variant, it is possible that there are no residual stresses in the material(s) in the flap 114, and that the coefficients of thermal expansion are not different. Thus, after the second layer 112 forming the flap 114 has been etched, the flap does not deform and the first part 116 of the flap 114 remains in position in contact with the first layer 110. However, given the low or practically zero adhesion force between the first and second layers 110, 112, the first part 116 of the flap 114 does not hermetically close or seal the hole 108. Thus, leaks between the first part 116 of the flap 114 and the first layer 110 enable etching agents to pass between the first layer 110 and the first part 116 of the flap 114 and to etch the first layer 110 and the sacrificial portion 104.

Figure 11:
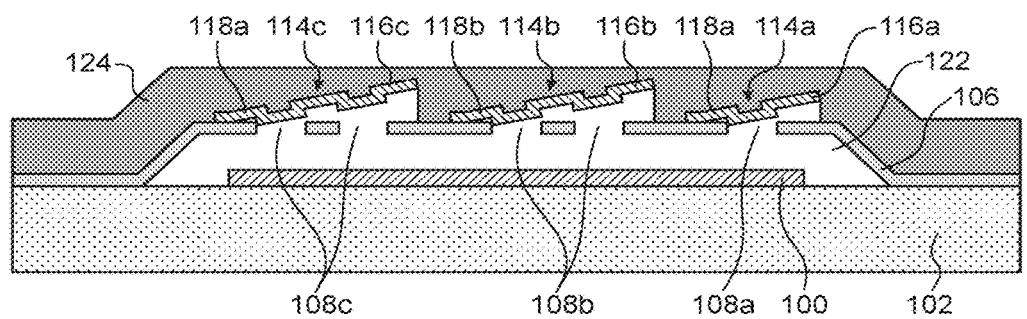
FIG. 11 shows different example embodiments of flaps formed when the method of making the closed cavity is used.

Furthermore, several holes 108 can be made through the cover 106 and several flaps 114 can be made on the same cover 106. It is also possible that a flap 114 is made such that the first part 116 of this flap 114 is positioned facing several holes 108. FIG. 11 shows several holes 108 made through the cover 106. A first hole 108a is formed through the cover 106 and a first flap 114a is made such that its first part 116a is placed facing this hole 108a. Two second holes 108b are made through the cap 106 and a second flap 114b common to these two holes 108b is made such that its first part 116b is placed facing these two holes 108b. Two third holes 108c are made through the cap 106 and a third flap 114c common to these holes 108c is made such that its first part 116c is placed facing these two holes 108c.

A method of making the closed cavity 122 used to encapsulate the microelectronic device 100 according to a second embodiment is described below with reference to FIGS. 12 to 18.

Figure 12:
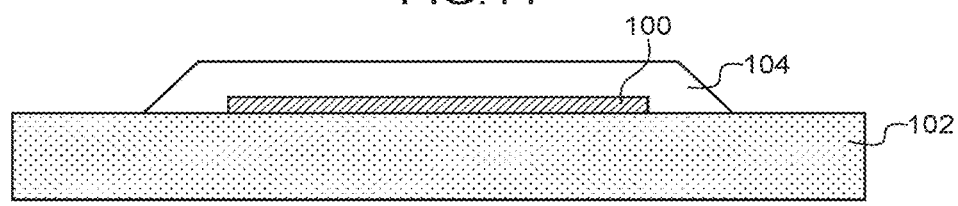
Figure 13:
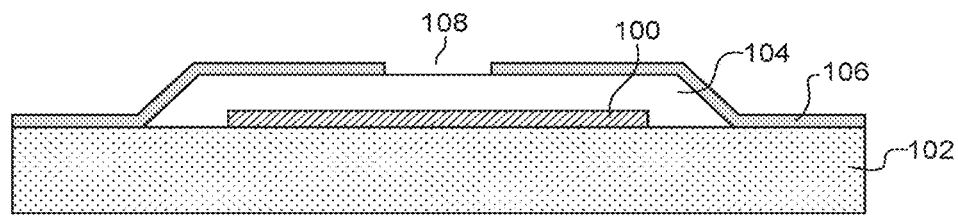

As described previously for the first embodiment, the microelectronic device 100 is firstly made on the substrate 102. The sacrificial portion 104 is then made on the substrate 102 such that it covers the device 100 and its volume corresponds approximately to the volume of the cavity 122 in which the device 100 will be encapsulated (FIG. 12). The cover 106 covering the sacrificial portion 104 is then made. At least one hole 108 is made through the cover 106 (FIG. 13).

Unlike the first embodiment in which there is a high adhesion force between the material of the flap 114 deposited on the cover 106 and the material of the cover 106, and in which the first layer 110 is formed on the cover 106 covering the first region of the cover 106 located around the hole 108 and such that the adhesion force between the first layer 110 and the first part 116 of the flap 114 is low or practically zero, in this case the flap 114 is made from at least one material with a practically zero or low adhesion force with the cover 106. The cover 106 and the second part 118 of the flap 114 are secured by means of the first layer 110 that does not cover the first region of the cover but is formed around this first region. The first layer 110 comprises a material such that an adhesion force between the first layer 110 and the second part 118 of the flap 114 is high, for example is greater than or equal to about 20 N/mm$^2$, to anchor the flap 114 to the cover 106.

Figure 14:
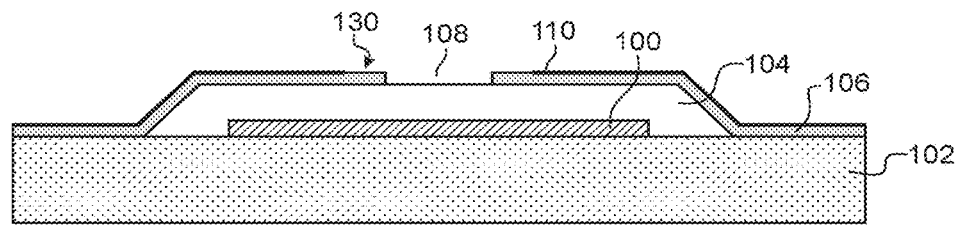

Therefore on FIG. 14, the first layer 110 is deposited on the entire cover 106, and is then etched to eliminate the part of this first layer 110 located at the first region of the cover 106 that will be facing which the first part 116 of the flap 114 will be located. In the example described herein, the first layer 110 may comprise titanium deposited by PVD on the cover 106, followed by photolithography and dry reactive ion etching (RIE) is then applied to form an opening 130 in the first layer 110 located facing the first region of the cover 106 at which the first part 116 of the flap 114 will be located.

In the example in FIG. 14, only the parts of the first layer 110 located at the first region of the cover 106 are etched. According to another possible embodiment, the first layer 110 can be etched such the only portion that remains is located at the second region of the cover 106 at which the second part 118 of the flap 114 will be anchored.

The second layer 112 from which the flap 114 is made is then deposited on the entire structure previously obtained (FIG. 15). The second layer 112 may for example be made from a bilayer comprising a first Au layer with a thickness for example equal to about 1 µm deposited by PVD or by evaporation with no residual stress on the first layer 110, on the first region of the cover 106 located facing the opening 130 and in the hole 108, and also comprising a second layer of titanium for example with a thickness equal to about 20 nm with a residual stress in tension of around a hundred MPa and deposited on the first Au layer.

In this second embodiment, when the cover 106 comprises for example $SiO_2$ and the flap 114 is made from a second layer 112 comprising a noble metal such as Au, Pt or Ni, the first layer 110 may comprise metal such as Ti.

Photolithography and wet etching are then performed on the second layer 112 such that a remaining portion of the second layer 112 forms the flap 114 (FIG. 16). The second part 118 of the flap 114 is in contact with the first layer 110 and is thus fixed or anchored to the cover 106 through the first layer 110.

The sacrificial portion 104 is then eliminated by etching agents, for example one or several release gases such as an $O_2$ plasma, brought into contact with the sacrificial portion 104 from the access formed by the space 120 and the hole 108. Elimination of the sacrificial portion 104 forms the cavity 122 in which the microelectronic device 100 is encapsulated (FIG. 17).

The cavity 122 is then closed by depositing the plugging material 124 on the entire structure made, as described previously for the first embodiment (FIG. 18).

The different variant embodiments described above for the first embodiment (in which flap 114 is made from one or several materials that may or may not have different residual stresses and/or different coefficients of thermal expansion, formation of several holes 108 and/or several flaps 114 on the cover 106) can also be applied to the second embodiment and can procure the same advantages as those described above for the first embodiment.

The invention claimed is:

1. Method for making at least one closed cavity, comprising at least:
   making a sacrificial portion on a substrate;
   making a cover covering the sacrificial portion;
   making at least one hole through the cover;
   making a first layer on the cover such that, in a first configuration, the first layer covers at least a first region of the cover located around the hole, or in a second configuration, the first layer surrounds the first region of the cover;
   depositing at least one second layer covering the cover and on top of the first layer and such that in the first configuration, an adhesion force between the first and the second layers is less than an adhesion force between the second layer and a second region of the cover adjacent to the first region of the cover or, in the second configuration, an adhesion force between the second layer and the first region of the cover is less than an adhesion force between the first and second layers, wherein the second region is arranged around the first region;

etching thy: second layer such that a remaining portion of the second layer forms at least one flap, of which a first part located facing the hole and the first region of the cover is deformed away from the hole and the cover, and of which a second part is fixed to the second region of the cover;

etching the sacrificial portion through the hole, forming the cavity between the cover and the substrate;

closing the cavity by a deposition of a plugging material at least on the first part of the at least one flap and at least a part of the cover around the first region of the cover, wherein the second layer comprises at least first and second distinct materials superposed such that the first material is located between the second material and the cover, the first material having a higher coefficient of thermal expansion than the second material, and wherein etching of the sacrificial portion is done at a temperature leading to a deformation of the first part of the at least one flap due to thermal expansion of the first and second materials, creating a space between the first part of the at least one flap and the first region of the cover.

2. Method according to claim 1, in which in the first configuration the at least one flap adheres to the second region of the cover and does not adhere to the first layer or, in the second configuration, the at least one flap adheres to the first layer and does not adhere to the first region of the cover.

3. Method according to claim 1, in which in the first configuration, the adhesion force between the first and second layers is less than about 2 N/mm², or in the second configuration, the adhesion force between the second layer and the first region of the cover is less than about 2 N/mm².

4. Method according to claim 1, in which in the first configuration, part of the first layer is located in the hole, and in which etching of the sacrificial portion is preceded by etching at least part of the first layer located in the hole.

5. Method according to claim 1, in which in the first configuration, the adhesion force between the second layer and the second region of the cover is greater than or equal to about 20 N/mm² or, in the second configuration, the adhesion force between the first and second layers is greater than or equal to about 20 N/mm².

6. Method according to claim 1, in which in the first configuration, the first layer comprises at least one polymer, or in the second configuration, thy: first layer comprises at least one metal.

7. Method according to claim 1, in which the second layer has a residual stress generating a deformation in the first part of the at least one flap after the second layer has been etched, creating the space between the first part of the at least one flap and the first region of the cover and such that the first part of the at least one flap remains facing the hole.

8. Method according to claim 1, in which residual stresses with different values or different types, or with different values and different types, creating a deformation of the first part of the at least one flap creating the space between the first part of the at least one flap and the first region of the cover, after etching of the second layer.

9. Method according to claim 8, also comprising an etching step of at least part of the second material, between etching of the sacrificial portion and closing of the cavity.

10. Method according to claim 8, in which there is a residual stress in either the first material or the second material, or in both.

11. Method according to claim 10, in which the residual stress is either a compressive or a tensile stress.

12. Method according to claim 8, in which the first material contains $SiO_2$ and the second material contains nickel.

13. Method according to claim 8, in which the second material comprises a stack of titanium and nickel such that titanium is arranged between the first material and the nickel.

14. Method according to claim 1, in which the material contains aluminium and the second material contains titanium.

15. Method according to claim 1, in which the plugging material is deposited at ambient temperature.

16. Method according to claim 1, in which the second layer comprises at least one getter material.

17. Method according to claim 1, in which several holes are made through the cover, and comprising at least one of the following characteristics:
    the first part of the at least one flap is located facing at least two of said holes,
    etching of the second layer forms several flaps such that the first part of each of the at least one flaps is located facing at least one of said holes.

18. Method according to claim 1, in which the sacrificial portion is made on the substrate such that it covers at least one microelectronic device located on the substrate, the microelectronic device being encapsulated in the closed cavity after the end of the method.

19. Method according to claim 18, in which the steps performed make collective encapsulation of several microelectronic devices located on the substrate.

* * * * *